United States Patent [19]
Boswell

[11] Patent Number: 5,674,580
[45] Date of Patent: Oct. 7, 1997

[54] PLASTIC FOIL FOR HOT LEAF STAMPING AND METHOD FOR FORMING

[75] Inventor: David R. Boswell, Woodley, England

[73] Assignee: NovaVision, Inc., Bowling Green, Ohio

[21] Appl. No.: 381,095

[22] Filed: Jan. 30, 1995

Related U.S. Application Data

[63] Continuation-in-part of Ser. No. 222,283, Apr. 4, 1994, Pat. No. 5,464,690.

[51] Int. Cl.$^6$ .................. A61F 13/02; B32B 7/02; B32B 15/08
[52] U.S. Cl. .............. 428/40.9; 428/41.4; 428/216; 428/458; 428/463; 428/464; 428/480; 428/484; 428/522; 428/41.1
[58] Field of Search ................ 428/216, 41, 42, 428/458, 4.63, 464, 480, 484, 522, 40.9, 42.3, 41.4

[56] References Cited

U.S. PATENT DOCUMENTS

| | | | |
|---|---|---|---|
| 4,012,552 | 3/1977 | Watts | 428/200 |
| 4,225,211 | 9/1980 | Abe | 359/29 |
| 4,340,438 | 7/1982 | Davis | 156/234 |
| 4,357,395 | 11/1982 | Lifshin et al. | 428/607 |
| 4,378,141 | 3/1983 | Yevick | 359/3 |
| 4,477,312 | 10/1984 | Czichy | 216/39 |
| 4,495,232 | 1/1985 | Bauser et al. | 428/40.2 |
| 4,545,838 | 10/1985 | Minkus et al. | 156/220 |
| 4,603,937 | 8/1986 | Copp | 359/11 |
| 4,629,647 | 12/1986 | Sander | 428/172 |
| 4,631,222 | 12/1986 | Sander | 428/172 |
| 4,657,803 | 4/1987 | Pernicano | 428/200 |
| 4,701,235 | 10/1987 | Mitsam | 156/233 |
| 4,717,615 | 1/1988 | Reinhart | 428/161 |
| 4,725,111 | 2/1988 | Weitzen et al. | 359/12 |
| 4,728,377 | 3/1988 | Gallagher | 156/58 |
| 4,758,296 | 7/1988 | McGrew | 156/231 |
| 4,759,969 | 7/1988 | Sander | 428/209 |
| 4,773,718 | 9/1988 | Weitzen et al. | 359/3 |
| 4,778,262 | 10/1988 | Haines | 359/9 |
| 4,832,445 | 5/1989 | Haines et al. | 359/2 |
| 4,837,072 | 6/1989 | Kraetschmer | 428/201 |
| 4,856,857 | 8/1989 | Takeuchi et al. | 359/3 |
| 4,877,710 | 10/1989 | Ishikawa | 430/38 |
| 4,892,602 | 1/1990 | Oike et al. | 156/233 |
| 4,893,887 | 1/1990 | Coates | 359/1 |
| 4,900,111 | 2/1990 | D'Amato et al. | 359/1 |
| 4,908,285 | 3/1990 | Kushibiki et al. | 430/1 |
| 4,913,504 | 4/1990 | Gallagher | 359/1 |
| 4,913,858 | 4/1990 | Miekka et al. | 264/1.34 |
| 4,921,319 | 5/1990 | Mallik | 359/1 |
| 4,933,120 | 6/1990 | D'Amato et al. | 264/1.34 |
| 4,969,700 | 11/1990 | Haines | 359/9 |
| 4,971,646 | 11/1990 | Schell et al. | 156/244.17 |
| 4,976,799 | 12/1990 | Wood | 156/106 |
| 4,978,593 | 12/1990 | Yin et al. | 430/2 |
| 4,990,415 | 2/1991 | Yu | 430/2 |
| 4,994,131 | 2/1991 | Edwards | 156/233 |
| 5,003,915 | 4/1991 | D'Amato et al. | 118/46 |
| 5,013,494 | 5/1991 | Kubo et al. | 264/1.31 |
| 5,013,632 | 5/1991 | Weber | 430/281.1 |
| 5,044,707 | 9/1991 | Mallik | 359/2 |
| 5,053,260 | 10/1991 | Brehm | 428/41.2 |
| 5,063,658 | 11/1991 | Wild | 29/846 |
| 5,071,597 | 12/1991 | D'Amato et al. | 264/1.34 |
| 5,083,850 | 1/1992 | Mallik et al. | 359/1 |
| 5,085,514 | 2/1992 | Mallik et al. | 359/2 |

(List continued on next page.)

*Primary Examiner*—Leszek Kiliman
*Attorney, Agent, or Firm*—Emch, Schaffer, Schaub & Porcello Co., L.P.A.

[57] ABSTRACT

A plastic foil for hot leaf stamping includes a layer of metal having a thickness in the range of 20 millimicrons to 100 millimicrons, a lacquer coating having a thickness in the range of 0.5 microns to 3 microns and a heat activatible adhesive. The metal layer lacquer coating and heat activatible adhesive are caused to be adhered to the substrate forming the final article during a stamping operation which releases said metal layer, lacquer coating and heat activatible adhesive from a plastic carrier film to which had initially been applied. Methods for forming such foil and for forming a decoration image on a substrate using such foil are also provided.

8 Claims, 4 Drawing Sheets

U.S. PATENT DOCUMENTS

| | | | |
|---|---|---|---|
| 5,087,510 | 2/1992 | Tokas et al. | 428/209 |
| 5,116,548 | 5/1992 | Mallik et al. | 264/1.34 |
| 5,128,779 | 7/1992 | Mallik | 359/2 |
| 5,142,383 | 8/1992 | Mallik | 359/2 |
| 5,145,212 | 9/1992 | Mallik | 283/86 |
| 5,155,604 | 10/1992 | Miekka et al. | 359/2 |
| 5,162,927 | 11/1992 | Moss et al. | 359/3 |
| 5,164,227 | 11/1992 | Miekka et al. | 427/162 |
| 5,172,250 | 12/1992 | Tsuchiya et al. | 359/1 |
| 5,186,787 | 2/1993 | Phillips et al. | 216/36 |
| 5,189,531 | 2/1993 | Palmer et al. | 359/3 |
| 5,191,449 | 3/1993 | Newswanger | 359/22 |
| 5,194,971 | 3/1993 | Haines | 359/9 |
| 5,199,744 | 4/1993 | Shenton | 283/91 |
| 5,300,169 | 4/1994 | Tahara | 156/230 |

PLASTIC FOIL FOR HOT LEAF STAMPING AND METHOD FOR FORMING

CROSS REFERENCE TO RELATED APPLICATION

This is a continuation-in-part of application Ser. No. 08/222,283 filed on Apr. 4, 1994 now U.S. Pat. No. 5,464,690.

BACKGROUND ART

The use of plastic foil for hot leaf stamping images and printing on a substrate has become extremely widespread. Hot stamping transfer foils are generally used with hot stamp machines to stamp images onto various substrates such as paper, plastic film or rigid substrates. Typically, the image is formed by utilizing a metal, silicone or other die into which the image has been cut. The metal die is placed in the hot stamping machine and is used to press the image into the hot stamp foil utilizing a combination of heat and pressure. A heat activated adhesive is placed on the back side of the foil which, upon application of heat becomes tacky and adheres to the substrate.

U.S. Pat. No. 5,186,787 discloses a certain construction of foil and a high resolution.

DISCLOSURE OF THE INVENTION

Frequently, the images formed using hot stamping of foils are fuzzy or otherwise of less than desirable quality. The foil of the present invention, upon hot stamping provides high quality images on substrates on an economical basis.

Accordingly, it is an object of the present invention to provide a new and useful foil which is particularly well-suited for use in hot stamping images onto a substrate.

The present invention provides new and unique articles of manufacture and a method for forming images on a substrate with a high degree of quality and on an economical basis.

Accordingly, it is an object of the present invention to provide a method for forming a high quality image on a substrate using foil of the invention and a hot stamping head and to do so with high production efficiency and low cost.

It is a further object of the present invention to provide a composite sheet and method for forming such composite sheet which may be used as a foil in hot stamping process to form an image on the substrate of the intended finished document or article.

These and other objects of the present invention will become readily apparent from the following detailed description along with the appended drawings.

Other prior art patents which show various constructions of composite films or foils include U.S. Pat. Nos. 4,357,395; 4,495,232; 4,477,312; 4,728,377; 4,908,285 and 4,994,131.

BEST MODE OF CARRYING OUT THE INVENTION

Figure 1:
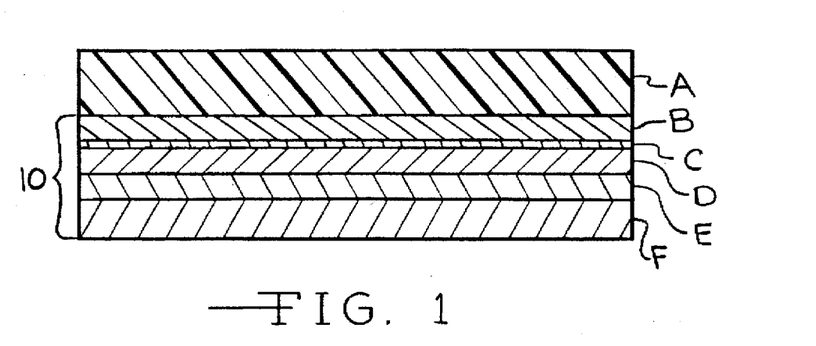
FIG. 1 is a schematic view showing a cross section of one embodiment of composite sheet affixed to a carrier film, which composite sheet may be used in applying an image to a substrate by hot stamping.

Referring now to FIG. 1, there is shown one construction of composite sheet which may be used for applying a hologram directly to a substrate. There is shown in FIG. 1 a composite sheet 10 affixed to a film substrate A. The film substrate A has a thickness in the range of 12 microns to 50 microns and may be formed of one of a number of different types of material including a film of polyester such as polyethyleneterephthalate or a film of biaxially oriented polypropylene, cellulose tri-acetate, polystyrene, polyethylene or polyvinylchloride. In the embodiment of FIG. 1, a release coating B of a wax such as a microcrystalline wax or a partially saponified montan wax or a siloxane having a thickness in the range of 0.025 microns to 1 micron is applied to the film substrate A. A very thin layer of metal C having a thickness in the range of 20 millimicrons to 100 millimicrons is applied to the release coating B by vacuum metal deposition or sputtering or electron beam deposition. The metal layer C is preferably aluminum; however, it could be stainless steel, nichrome, gold, silver, platinum or any other metal which can be vaporized and deposited by vacuum deposition or applied by sputtering or electron beam deposition.

A coating D of a lacquer such as acrylic, styrene acrylonitrile, polyethyleneterephthalate or nitrocellulose is applied to the metal layer in a thickness in the range of 0.5 microns to 3 microns. The coating D is preferably a thermosoftening lacquer applied from solution and containing acrylic and/or nitrocellulose and/or chlorinated rubber. The lacquer may also contain ultraviolet cured resins.

A tie coating E is then applied to the lacquer coating D. The tie coating E is a material which is preferably the same type of material used for the lacquer coating D but a much thinner layer. The tie coating E has a thickness in the range of 0.05 microns to 0.2 microns. It has been discovered that the use of a tie coating such as the tie coating E increases the bond between the lacquer coating D and the adhesive coating F.

The final coating for the composite sheet 10 is a heat activated adhesive coating F which is formulated for its ability to adhere to the particular substrate to be used in the final decorated article. Such substrate, for example, might be paper, coated paper or a plastic such as polyethyleneterephthalate, polyvinylchloride, oriented polypropylene, acetate or the like. Heat activated adhesives are well known and can be readily obtained for use in adhering to any of the above types of substrates. For example, depending on the substrate, the heat activated adhesive coating F could be a mixture of vinyl acetate, vinyl alcohol copolymer and other heat softening resins dissolved in a mixture of ethanol and water, if intended for graphics use. The thickness of the heat activated adhesive coating may be in the range of 0.75 microns to 4 microns.

The purpose of the tie coating E is to increase the bond between the lacquer coating D and the adhesive coating F. However, as will be apparent for the various modifications to be disclosed herein, the tie coating E may be omitted.

Figure 2:
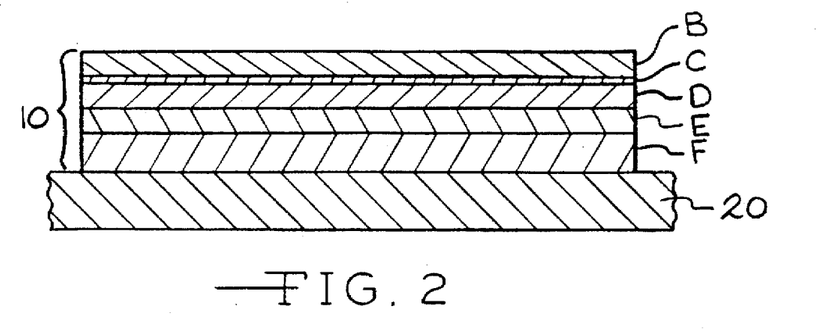
FIG. 2 is a view similar to FIG. 1 but showing the composite sheet removed from the carrier film and adhered to the substrate of the intended finished document or other article.

FIG. 2 shows schematically the construction following the next step of the method. In FIG. 2 there is shown the composite sheet 10 removed from the film substrate A and adhered to a document substrate 20, with the heat activated adhesive coating F facing and adhered to such document substrate 20. Removal of the film substrate A leaves the composite sheet 10 with the release coating B exposed. The document substrate 20 may be of any desired material to which the heat activated adhesive may adhere including but not limited to paper, printed or security paper, coated paper or a wide variety of plastic film or sheet such as those used for the film substrate A.

Figure 3:
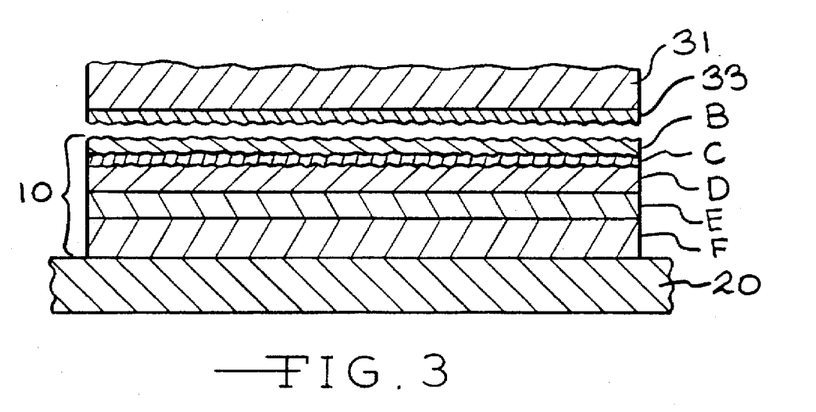
FIG. 3 is a schematic view showing a cross section of the finished article with the image embossed in the surface opposite the substrate.

Referring to FIG. 3, the composite sheet 10 is shown adhered to the substrate 20 and forms the image portion of the final decorated article which has been stamped thereon by a hot stamping head 26 carrying a die 28.

Figure 4:
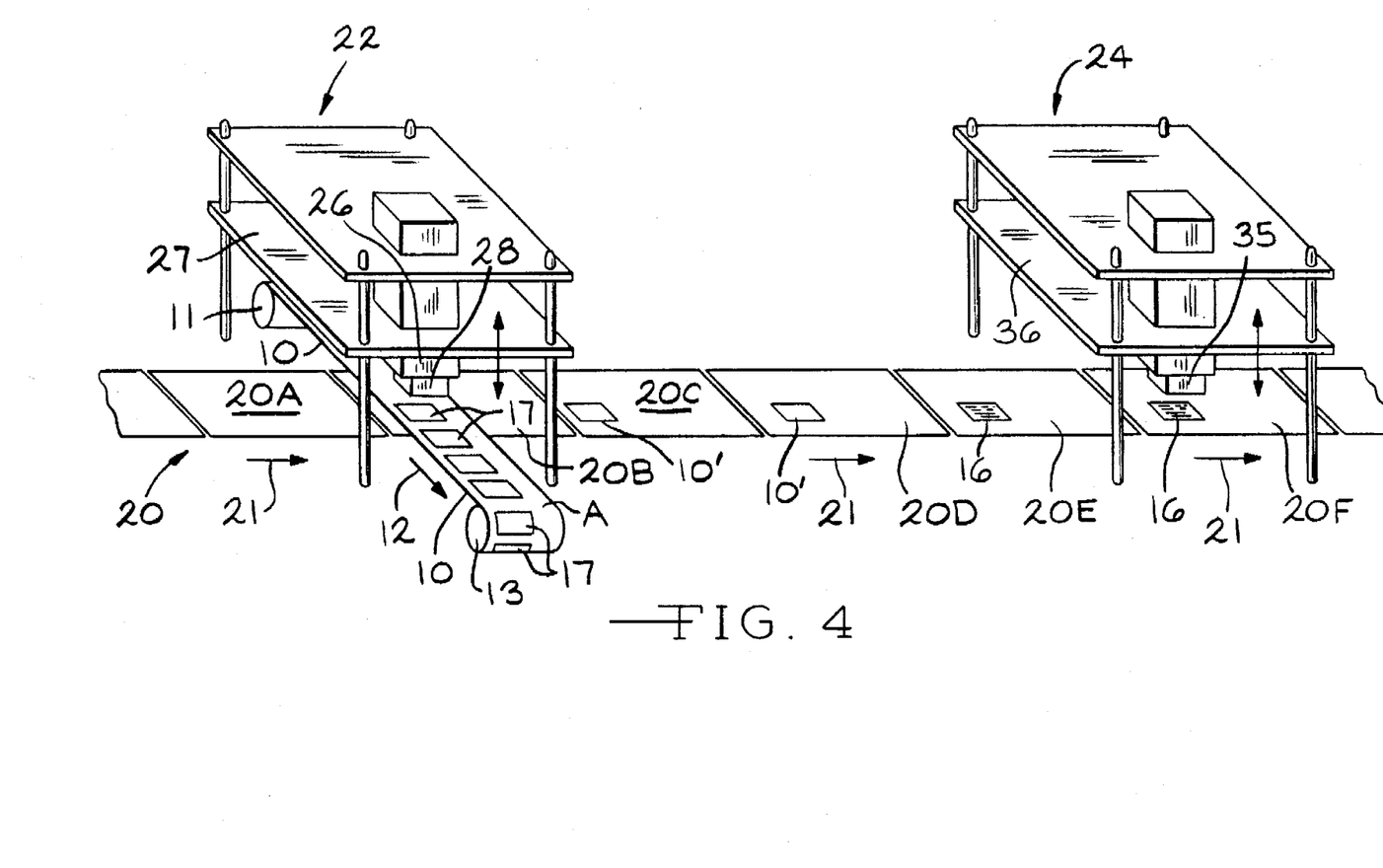
FIG. 4 is a schematic view showing one type of apparatus for hot stamping an image upon the composite sheet of FIG. 1 or a chip portion thereof adhered to a substrate forming the main portion of the final document.
Figure 6:
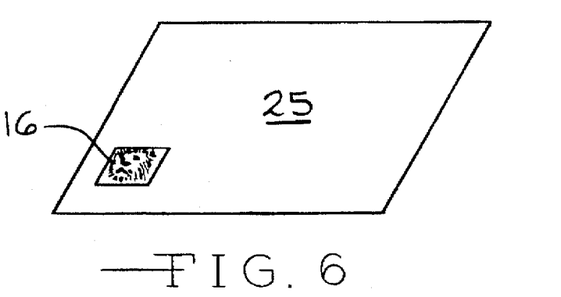
FIG. 6 is a perspective view of a finished document manufactured according to the present invention.

Referring now to FIG. 4, there is shown schematically one apparatus and process for successively hot stamping small areas of the composite sheet 10 to the substrate 20 thereby leaving a small portion of composite sheet 10 which may be characterized as a chip 10' having an area the size of the stamping head adhered to the substrate 20. As shown, the substrate 20 is a continuous strip containing a series of discrete, interconnected sections 20A, 20B, 20C, 20D, 20E and 20F, etc., and is fed along a horizontal path from a supply roll (not shown) to a take-off station (not shown). The sections 20A, 20B, 20C, 20D, 20E, and 20F, etc., may have printing and constitute the major portions of finished article with a decoration image to be stamped thereon. For example, there is shown in FIG. 6 a document or other substrate 25 having an image 16 stamped thereon.

The substrate 20 could, therefore, be formed of various types and qualities of paper, including papers coated with a wide variety of plastics or other materials or a film of plastic such as polyethyleneterephthalate, polyvinylchloride, oriented polypropylene, polyethylene, acetate or the like. Assuming the substrate 20 has printing thereon, the interconnected sections 20A, 20B, 20C, 20D, 20E, and 20F, etc., will preferably be fed with the primary printing information facing upward if it is desired to have the decoration image affixed to the primary viewing surface; however, it could obviously be reversed if it was desired to have the decoration image affixed to the reversed side. The continuous strip of substrate 20 is fed in the generally horizontal path in a first direction denoted by the arrows 21 beneath a stamping station 22 and, thereafter, if desired, it may also be fed through a protective overlay station 24.

The composite sheet 10, while affixed to the film substrate A is fed from a supply roll 11 beneath the stamping station 22, over the substrate 20 and in closely adjacent relationship thereto. The combination composite sheet 10 and film substrate A is fed in a second direction indicated by the arrow 12 at substantially 90° angle to the first direction 21. The composite sheet 10 is positioned with the heat activated layer F contacting the substrate 20 and the film substrate A facing up or away from the substrate 20. The film substrate A and the portions of the layers B, C, D, E and F of the composite sheet 10 not transferred to the substrate 20 are taken up by a take-up roll 13.

The stamping station 22 is provided with a hot stamping head 26 carrying a die 28 and, directly thereunder a flat support plate (not shown). The hot stamping head 26 and die 28 are maintained at a temperature in the range of 75° C. to 250° C. and are mounted on a platform 27 for movement between a raised position shown in FIG. 4 and a lowered position. When the platform 27 is in a lowered position, the die 28 engages the film substrate A, heating it and the composite sheet 10 to a temperature in the range of 75° C. to 250° C. and urging the composite sheet 10 against the underlying section of substrate 20 and against the support plate. In FIG. 4, the underlying section is 20B. Immediately prior to engagement of the die 28 to the against the film substrate A, the composite sheet 10 with the film substrate A and the continuous strip of document or article substrate 20 are caused to briefly stop, with movement resuming when the head 26 and die 28 are raised.

As a result of the heat and pressure to which the film substrate A and composite sheet 10 and the successive sections of substrate 20 are subjected by clamping between the die 28 and the support plate, the heat activated adhesive layer F is caused to become adhered to the specific section of the substrate so engaged, section 20B, as shown in FIG. 4. At the same time, the heat causes the release coating B of the composite sheet 10 to separate from the film substrate A with the result that the section 20B has affixed thereto a chip 10' portion of the composite sheet 10 constituting the release coating B, the metal layer C, the lacquer coating D, the tie coating E and the heat activated adhesive F in a size corresponding to the size of the die 28. The die 28 is flat in order to provide substantially uniform heat and pressure to the underlying portion of the composite sheet 10 and section 20B during the stamping operation and thus ensure uniform adhesion of the adhesive layer F to the section 20B and uniform release of the release coating B from the film substrate A. The hot stamping head 26 and die 28 should be maintained at a temperature in the range of 75° C. to 250° C. in order to bring the contacted portion of the composite sheet 10 to such temperature range. As may be seen in FIG. 4, those portions of the film substrate A and composite sheet 10 which were subjected to heat and pressure by the die 28 appear as a series of windows 17 containing only the film substrate A while the remaining portions being taken up by the take-up roll 13 consist of the film substrate A and all layers of the original composite sheet 10, namely, B, C, D, E and F.

After leaving the stamping station 22, the sections 20B, 20C, 20D, etc., are moved to the protective overlay station 24. As shown in FIG. 4, section 20F is positioned at the protective overlay station 24 with its decorated image 16 positioned beneath a head 35 carrying overlay lacquer suitable for providing an abrasion resistant coating to the decorated image 16. The head 35 is mounted on a platform 36 moveable between a raised position shown in FIG. 4 to a lowered position in which the head 35 may engage and apply the protective coating layer to the holographic image 16. Preferably, a back up plate (not shown) is positioned beneath the head 35. Following application of the protective coating layer, the section may be cut from the continuous strip thus forming the final article 25 shown in FIG. 6.

Figure 7:
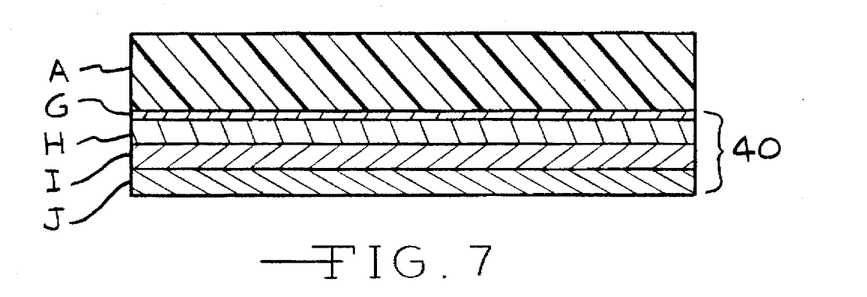
FIG. 7 is a schematic view showing a cross section of a second embodiment of composite sheet affixed to a carrier film, which composite sheet may be used in applying the image to a substrate.

Referring now to FIG. 7, there is shown a further embodiment in which there is provided a film substrate A and a composite sheet 40 having a slightly modified construction from that of the first embodiment of composite sheet 10. The construction of the composite sheet 40 is similar to that of the composite sheet 10 with the exception that there is no release coating between the film substrate to be released following application to the document and the metal layer. Thus, the composite sheet 40 consists of a layer G of metal, a coating H of lacquer, a tie coating I and a layer J of heat activated adhesive. The metal layer G is a very thin layer of metal having a thickness in the range of 20 millimicrons to 100 millimicrons. The metal layer G may be applied by vacuum metal deposition, sputtering, or electron beam deposition and is preferably aluminum; however, it could be stainless steel, nichrome, gold, silver, platinum or any other metal which can be vaporized and deposited by vacuum deposition or applied by sputtering or electron beam deposition. It has been discovered that although a release coating such as that utilized in the embodiment of FIG. 1 may be used, its presence is not absolutely necessary and, in fact, there may be some benefits in not utilizing such a release coating. It has been found that there is a natural tendency for the metal layer G to be rejected from the plastic film substrate A with the result that it along with the other layers of the composite sheet 40 of the embodiment of FIG. 7 may be readily separated from the film substrate A following the stamping operation at the stamping station 22. The remaining layers of the embodiment of FIG. 7 are identical to the final three layers of the embodiment of FIG. 1 with the coating H of lacquer being a member of the group of acrylic, styrene acrylonitrile, polyethyleneterephthalate or nitrocellulose applied to the metal layer G in a thickness in the range of 0.5 microns to 3 microns. Preferably, the lacquer is a thermosoftening lacquer applied from solution and containing acrylic and/or nitrocellulose and/or chlorinated rubber or ultraviolet cured resin.

The tie coating I applied to the lacquer coating H is similar to the tie coating E of the embodiment of FIG. 1.

The layer J of heat activated adhesive is applied to the tie coating I and, as in the previous embodiment, the heat activated adhesive is one which may vary depending upon the specific type of material to be used for the substrate 20 to which the chips 10' of decoration image are to be applied.

Figure 8:
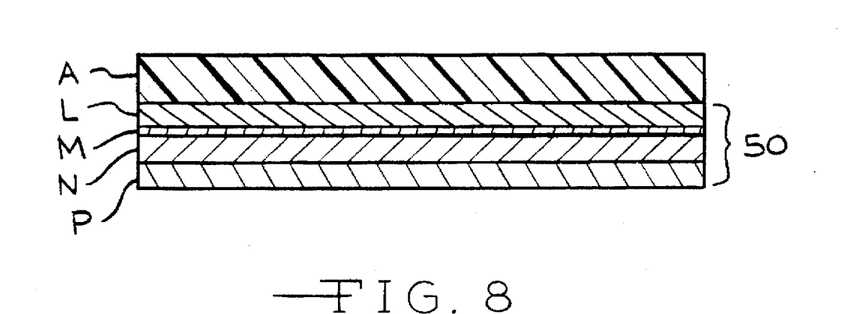
FIG. 8 is a view similar to FIG. 7 showing yet another embodiment of composite sheet affixed to a carrier film.

Referring now to FIG. 8, there is shown another embodiment having a slightly different construction of composite sheet 50 affixed to the film substrate A. This embodiment is similar to the embodiment of FIG. 1 with the exception that there is no tie coating between the lacquer coating and the heat activated adhesive. Thus, in the embodiment of FIG. 8, there is provided a film substrate A to which the composite sheet 50 is affixed.

The composite sheet 50 includes a release coating L of a wax or siloxane having a thickness in the range of 0.025 microns to 1 micron applied to the film substrate A. The wax is preferably a microcrystalline wax or a partially saponified montan wax. A very thin layer M of metal having a thickness in the range of 20 millimicrons to 100 millimicrons is applied to the release coating L in the manner previous described.

A coating N of lacquer of the type previously described is applied to the metal layer M in a thickness in the range of 0.5 microns to 3 microns.

Applied directly to the lacquer coating N is a heat activated adhesive coating P which, as in the previous embodiments, will vary depending upon the type of material to be used for the final substrate.

Figure 9:
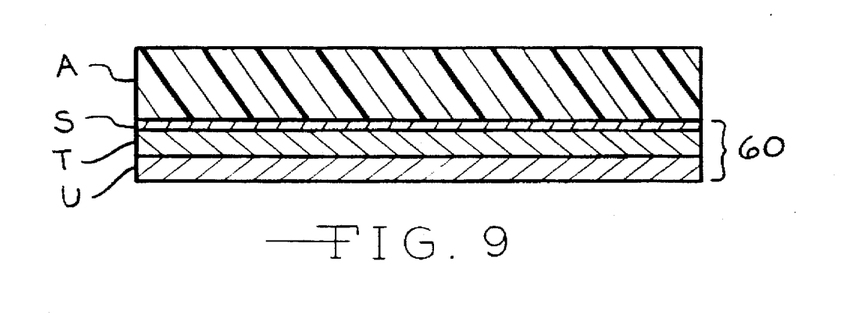
FIG. 9 is a view similar to FIG. 7 showing still another embodiment of composite sheet affixed to a carrier film.

Referring now to FIG. 9, there is shown another embodiment of composite sheet 60 affixed to a film substrate A. According to this embodiment, there is neither a release coating nor a tie coating. Thus, in the embodiment of FIG. 9, the composite sheet 60 comprises a metal layer S which is applied directly to such film substrate A. The metal layer S is the same as that utilized for the metal layer B in the embodiment of FIG. 1. A lacquer coating T such as that previously described is applied to the metal layer S in a thickness in the range of 0.5 to 3 microns. Applied directly to the lacquer coating T is a heat activated adhesive coating U which is similar to the coating F of the embodiment of FIG. 1 and will vary depending upon the type of material used for the final substrate.

Figure 5:
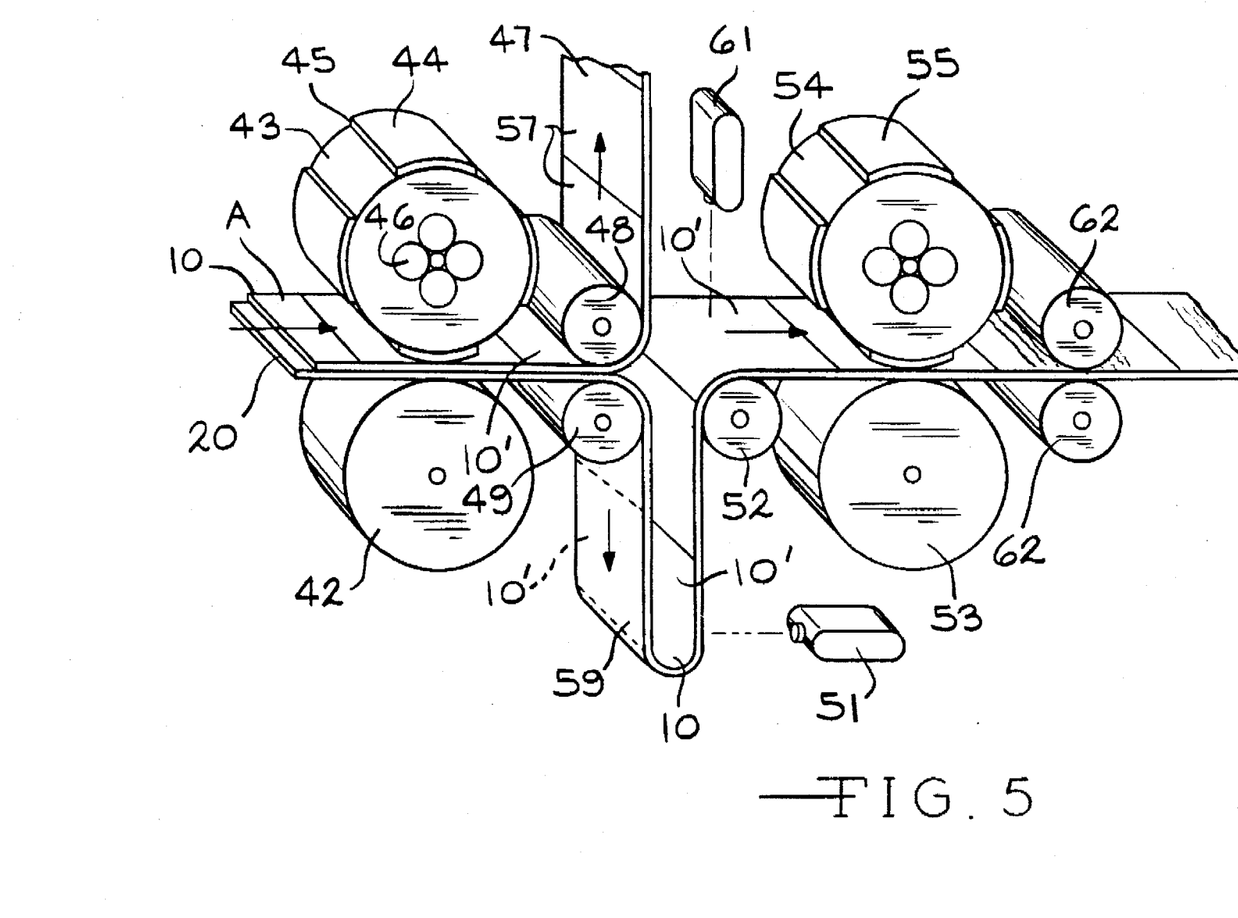
FIG. 5 is a schematic view showing another type of apparatus for directly applying an image to a substrate.

Referring now to FIG. 5, there is shown a modified apparatus for applying a chip 10' of the composite sheet 10 to the substrate to form the final article on a continuous basis. As shown in FIG. 5 the substrate 20 and the film substrate A with the affixed composite sheet 10 are fed in surface to surface engagement between a nip roller 42 and a heated metal roller 43 having aluminum or other type of metal dies 45 which are intermittently spaced around the circumference of the metal roller 43 and which may, if desired, have a silicon rubber 44 thereon. The adhesive layer F of the composite sheet 10 is facing and in contact with the final article substrate 20. The nip roller 42 may be metal or a metal with a silicon rubber coating and is maintained at ambient temperature. The metal roller 43 is heated as by internal cartridge heaters 46. The internal cartridge heaters may reach a temperature up to 400° C. and heat the aluminum dies 45 such that the temperature of the surface of the silicon rubber 44 is maintained at a temperature between 75° C. and 250° C.

As the combination film substrate A and composite sheet 10 and the final article substrate 20 are fed together between the nip roller 42 and the metal roller 43, those portions of the composite sheet 10 which are subjected to heat and pressure between the aluminum dies 45 with their silicon rubber 44 and the nip roller 42 are caused to be released from the film substrate A such that a chip 10' consisting of the release coating B and the remaining layers C, D, E and F is adhered to the final article substrate 20. A chip 10' bearing the decoration image is stamped to the substrate 20 by each of the aluminum dies 45 with their silicon rubber thus forming a series of intermittent decorated image stamped chips 10'. That portion of the film substrate A and those portions of the composite sheet 10 not contacted by the aluminum dies 45 are removed as a continuous strip of waste material 47 by being separated from the document substrate 20 after passing through a pair of drive shafts 48 and 49. Those portions of the film substrate A and composite sheet 10 which were contacted by the aluminum dies 45 appear on the strip of waste material 47 as a series of windows 57 containing only the film substrate A.

The final article substrate 20 with intermittent decorated image chips 10' adhered thereto under heat and pressure by the aluminum dies 45 with the silicon rubber 44 is moved around the lower driveshaft 49 downwardly to form a loop 59 the length of which is controlled by an optical sensor 51. It is then fed over a vacuum advance roller 52 so that it moves in a horizontal direction between a nip roller 53 and a heated roller 54 having aluminum dies 55 carrying a head 56 for applying the protective layer to the decorated image chips 10'. Following application of the protective layer, the sections may be cut to the appropriate length thereby forming the final article similar to the one shown in FIG. 6.

Although FIGS. 4 and 5 have been described in applying the composite sheet 10 of the embodiment of FIGS. 1-3, it is clear that the apparatus and method described with respect to FIGS. 4 and 5 can be used with the embodiments of FIGS. 7-9 using composite sheets 40, 50 and 60.

The present invention provides an effective and efficient method and article for forming documents and other goods with hot stamped decoration images.

Many modifications will become readily apparent to those skilled in the art. Accordingly, the scope of the present invention should be determined only by the scope of the appended claims.

I claim:

1. An article of manufacture comprising:
   (a) a plastic film substrate; and
   (b) a composite sheet engaged to said substrate and releasable therefrom upon application of heat and pressure, said composite sheet including:
      (i) a layer of metal having a thickness in the range of 20 millimicrons to 100 millimicrons facing said plastic substrate,
      (ii) a lacquer coating having a thickness in the range of 0.5 micron to 3 microns engaged to said layer of metal, said lacquer coating being a member selected from the group consisting of acrylic, styrene-acrylonitrile polymer, polyester and nitrocellulose, and
      (iii) a heat activatible adhesive having a thickness in the range of 0.75 micron to 4 microns; said composite sheet being adherable to a second substrate upon application of heat and pressure.

2. The combination of claim 1, wherein said layer of metal is aluminum.

3. The article of claim 1 further including a release coating of a wax or siloxane between said layer of metal and said substrate, said release coating having a thickness in the range of 0.025 micron to 1 micron.

4. The combination of claim 1 wherein said release coating is microcrystalline wax or a partially saponified montan wax.

5. The article of claim 2 further including a tie coating between said lacquer coating and said heat activatible adhesive, said tie coating having a thickness in the range of 0.05 micron to 0.2 micron and being a member selected from the group consisting of acrylic, styrene-acrylonitrile polymer, polyester and nitrocellulose.

6. The article of claim 5 further including a release coating of a wax or siloxane between said layer of metal and said substrate, said release coating having a thickness in the range of 01.025 micron and 1 micron.

7. The combination of claim 6 wherein said release coating is microcrystalline wax or a partially saponified montan wax.

8. An article of manufacture comprising:
   (a) a plastic film substrate; and
   (b) a composite sheet engaged to said plastic film substrate and releasable therefrom upon application of heat and pressure, said composite sheet including:
      (i) a release coating of a wax or siloxane between said layer of metal and said substrate having a thickness in the range of 0.025 micron to 1 micron.
      (ii) a layer of aluminum having a thickness in the range of 20 millimicrons to 100 millimicrons facing said substrate,
      (iii) a lacquer coating having a thickness in the range of 0.5 micron to 3 microns engaged to said layer of metal, said lacquer coating being a member selected from the group consisting of acrylic, styrene-acrylonitrile polymer, polyester and nitrocellulose,
      (iv) a tie coating having a thickness in the range of 0.05 micron to 0.2 micron and being a member selected from the group consisting of acrylic, styrene-acrylonitrile polymer, polyester and nitrocellulose, and
      (v) a heat activatible adhesive having a thickness in the range of 0.75 micron to 4 microns.

\* \* \* \* \*

UNITED STATES PATENT AND TRADEMARK OFFICE
CERTIFICATE OF CORRECTION

PATENT NO. : 5,674,580
DATED : October 7, 1997
INVENTOR(S) : David R. Boswell

It is certified that error appears in the above-identified patent and that said Letters Patent is hereby corrected as shown below:

Col. 7, line 33, delete "1" and insert --3--.

Col. 8, line 8, delete "01.025" and insert --0.025--.

Signed and Sealed this

Twenty-sixth Day of May, 1998

Attest:

BRUCE LEHMAN

*Attesting Officer*      *Commissioner of Patents and Trademarks*